United States Patent
Teunissen

(10) Patent No.: US 10,032,653 B2
(45) Date of Patent: Jul. 24, 2018

(54) MOULD, CARRIER WITH ENCAPSULATED ELECTRONIC COMPONENTS, SEPARATED ENCAPSULATED ELECTRONIC COMPONENT AND METHOD FOR ENCAPSULATING ELECTRONIC COMPONENTS

(71) Applicant: Besi Netherlands B.V., Duiven (NL)

(72) Inventor: Michel Hendrikus Lambertus Teunissen, Herwen (NL)

(73) Assignee: Besi Netherlands B.V., Duiven (NL)

( * ) Notice: Subject to any disclaimer, the term of this patent is extended or adjusted under 35 U.S.C. 154(b) by 0 days.

(21) Appl. No.: 14/771,575

(22) PCT Filed: Feb. 28, 2014

(86) PCT No.: PCT/NL2014/050123
§ 371 (c)(1),
(2) Date: Aug. 31, 2015

(87) PCT Pub. No.: WO2014/133390
PCT Pub. Date: Sep. 4, 2014

(65) Prior Publication Data
US 2016/0013078 A1    Jan. 14, 2016

(30) Foreign Application Priority Data
Mar. 1, 2013  (NL) .................................... 2010379

(51) Int. Cl.
*H01L 21/52*    (2006.01)
*H01L 21/56*    (2006.01)
(Continued)

(52) U.S. Cl.
CPC ...... *H01L 21/568* (2013.01); *B29C 45/14655* (2013.01); *B29C 45/37* (2013.01);
(Continued)

(58) Field of Classification Search
CPC ....... H01L 21/565; H01L 21/52; H01L 21/56; H01L 21/561; H01L 21/568; B29C 45/14073; B29C 45/14655
See application file for complete search history.

(56) References Cited

U.S. PATENT DOCUMENTS 4,451,973 A * 6/1984 Tateno ................. H01L 21/565
                                                174/528
4,641,418 A * 2/1987 Meddles ........... B29C 45/14655
                                                257/E21.504

(Continued)

FOREIGN PATENT DOCUMENTS

EP          2325901 A1    5/2011
JP         11317412 A    11/1999
(Continued)

*Primary Examiner* — Marc Armand
(74) *Attorney, Agent, or Firm* — The Webb Law Firm

(57) ABSTRACT

The invention relates to a mold for encapsulating electronic components mounted on a carrier, with at least two mold parts which are displaceable relative to each other for engaging with a mold cavity round electronic components, and at least one feed for encapsulating material recessed into the mold parts and connecting to the mold cavity. The invention also relates to a carrier with encapsulated electronic components. The invention further relates to a method for encapsulating electronic components and to the thus manufactured encapsulated separated components. The carrier is provided with a plurality of recessed through-openings located at a distance from the electronic components and an encapsulation arranged round the electronic components, wherein through-openings are recessed into the encapsulating material and wherein some of the through-openings recessed into the carrier coincide at least partially with the through-openings recessed into the encapsulating material.

8 Claims, 4 Drawing Sheets

(51) Int. Cl.
*B29C 45/14* (2006.01)
*B29C 45/37* (2006.01)
*H01L 21/78* (2006.01)
*H01L 23/31* (2006.01)

(52) U.S. Cl.
CPC .......... *H01L 21/561* (2013.01); *H01L 21/565* (2013.01); *H01L 21/78* (2013.01); *H01L 23/3107* (2013.01); *B29C 2793/009* (2013.01); *H01L 2924/0002* (2013.01)

(56) References Cited

U.S. PATENT DOCUMENTS

| | | | |
|---|---|---|---|
| 4,677,526 | A | 6/1987 | Muehling |
| 4,954,307 | A * | 9/1990 | Yokoyama ........ B29C 45/14073 249/91 |
| 8,530,250 | B2 | 9/2013 | Ichikawa et al. |
| 2001/0044169 | A1 | 11/2001 | Yasunaga et al. |
| 2004/0238923 | A1 | 12/2004 | Lee et al. |
| 2007/0090565 | A1 | 4/2007 | Ochi |
| 2009/0230487 | A1 | 9/2009 | Saitoh et al. |

FOREIGN PATENT DOCUMENTS

| | | | |
|---|---|---|---|
| JP | 2000124239 | A | 4/2000 |
| JP | 2009088412 | A | 4/2009 |
| JP | 2011142337 | A | 7/2011 |
| JP | 2012238740 | A | 12/2012 |

* cited by examiner

MOULD, CARRIER WITH ENCAPSULATED ELECTRONIC COMPONENTS, SEPARATED ENCAPSULATED ELECTRONIC COMPONENT AND METHOD FOR ENCAPSULATING ELECTRONIC COMPONENTS

CROSS-REFERENCE TO RELATED APPLICATIONS

This application is the United States national phase of International Application No. PCT/NL2014/050123 filed Feb. 28, 2014, and claims priority to Netherlands Patent Application No. 2010379 filed Mar. 1, 2013, the disclosures of which are hereby incorporated in their entirety by reference.

BACKGROUND OF THE INVENTION

Field of the Invention

The present invention relates to a mould for encapsulating electronic components mounted on a carrier, comprising at least two mould parts which are displaceable relative to each other and each provided with a contact side, and which are configured to engage with at least one mould cavity round the electronic components for encapsulating mounted on a carrier; and at least one feed for encapsulating material recessed into the mould parts and connecting to the mould cavity. The present invention also relates to a carrier with encapsulated electronic components. The present invention further relates to a separated encapsulated electronic component and to a method for encapsulating electronic components mounted on a carrier.

DESCRIPTION OF RELATED ART

The encapsulation of electronic components mounted on a carrier with an encapsulating material is a known art. On an industrial scale such electronic components are provided with an encapsulation, usually an encapsulation of a curing epoxy to which a filler material is added. There is a trend in the market toward simultaneous encapsulation of larger quantities of relatively small electronic components. Electronic components can be envisaged here such as semiconductors (chips, although LEDs are in this respect also deemed semiconductors) which are generally becoming increasingly smaller. Once the encapsulating material has been arranged the collectively encapsulated electronic components are situated in an encapsulation (package) which is arranged on one but sometimes also two sides of the carrier. The encapsulating material often takes the form here of a flat layer connected to the carrier. The carrier can consist of a lead frame, a multi-layer carrier—manufactured partially from epoxy—(also referred to as board or substrate and so on) or another carrier structure. Since the encapsulated components eventually have to be usable in individualized form, a subsequent production step consists of dividing the flat layer of encapsulating material with electronic components embedded therein into separate segments. According to the prior art different separating techniques can be applied for this purpose, such as sawing, laser cutting and water jet cutting. The advantages of laser cutting and water jet cutting are that there is greater shaping freedom during separation of the encapsulated electronic components; the encapsulated electronic components can in principle be individualized in any desired form. Significant drawbacks of laser cutting and water jet cutting however are that they are relatively slow processes, that the quality of separation usually leaves something to be desired, and that it is expensive. Sawing has the advantage that it can be done more quickly and inexpensively, although the drawback of sawing is that the freedom to shape the individualized encapsulated electronic components is limited.

The present invention has for its object to provide technical measures whereby encapsulated electronic components can be separated with great shaping freedom without the drawbacks of the existing separating methods which make the desired shaping freedom possible.

SUMMARY OF THE INVENTION

The invention provides for this purpose a mould for encapsulating electronic components mounted on a carrier, comprising at least two mould parts which are displaceable relative to each other and each provided with a contact side, and which are configured to engage with at least one mould cavity round the electronic components for encapsulating mounted on a carrier; and at least one feed for encapsulating material recessed into the mould parts and connecting to the mould cavity, wherein the carrier is provided with a plurality of recessed through-openings located at a distance from the electronic components and at least one of the mould parts is provided with protruding mould segments which protrude such that they are located in the mould cavity defined by the mould parts and thus define a part of the periphery of the encapsulations to be formed, wherein the protruding mould segments further have a contact side located in the contact surface of the mould part of which they form part, and the contact side is configured to engage on the carrier such that the contact side coincides at least partially with some of the through-openings recessed into the carrier. The protruding mould segments make it possible to arrange the encapsulating material only where it is required, at the position where the electronic components have to be encapsulated. At other locations, where the encapsulating material fulfils no function, it need not therefore be arranged. A first advantage here is that the quantity of encapsulating material required is reduced. The reduced use of encapsulating material is more advantageous because more efficient use is made of the encapsulating material and costs for the disposal and processing of waste are lower. Another advantage is that the separation can be simplified because separation need no longer take place over a part of the periphery of the encapsulations. This is because the (end) form desired after separation has already been at least partially imparted to the encapsulating material during arranging of the encapsulation. The result hereof is that less encapsulating material need be processed (separated), whereby the separation can be performed more quickly, and less generation of heat will also take place, and less wear of the separating means will occur. Yet another advantage is that the mould according to the present invention can be applied in existing production equipment, with only the mould requiring modification, and such a mould is usually manufactured anyway for a specific product. The present invention can thus be introduced without considerable costs having to be made for the purpose. A very significant advantage is that the present invention considerably increases the freedom in shaping the electronic components for separating. In the conventional production process, wherein the encapsulated electronic components are separated by means of sawing, the separated components are of rectangular form and have only straight peripheral sides. With the present invention it now becomes possible in simple manner to form the periphery of the separated components with great shaping freedom while the actual separation process can still continue to consist of arranging straight peripheral sides. This means that with the present invention a plurality of electronic components are still efficiently encapsulated with a collective "layer" of encapsulating material and that an efficient and effective separating method can still also be applied. An example of such an efficient and effective separating method is for instance sawing straight cuts into the carrier with electronic components on which encapsulating material has been arranged. Despite the fact that both encapsulating and separating can be performed in more or less conventional manner, it is now nevertheless made possible to manufacture separated products with a periphery which has one or more peripheral parts that are not straight.

The protruding mould segments here preferably define a part of the periphery of complex form in the encapsulations to be formed. Such a "part of the periphery of complex form" is defined as a form other than straight, such as defining for instance a rounded corner of the periphery of the encapsulations to be formed and/or a non-curved corner, a curved part of the periphery, a chamfered part of the periphery and so on. It is for instance also possible to cut away a part in a straight peripheral side (envisage for instance memory cards) and/or to give part of a peripheral side a curved form. In yet another embodiment variant one or more "corners" of the periphery of the separated encapsulated electronic components are provided with a curvature/radius.

In order to allow the through-openings in the encapsulating material that are to be arranged (or rather left clear) through the protruding mould segments to run as far as the carrier, the protruding mould segments have a contact side located in the contact surface of the mould part of which they form part. During the encapsulation the protruding mould segments will hereby lie against the carrier (with a surface pressure similar to the closing pressure with which the carrier is clamped on the periphery of the mould cavity), whereby encapsulating material is prevented from penetrating between the protruding mould segments and the carrier.

A plurality of electronic components for encapsulating are usually present on a single carrier. These electronic components are generally also separated from each other via a structured separation pattern. In such a structured separation pattern the openings recessed into the encapsulating material will usually also have to be present in a regulated structure; it is thus desirable to provide a mould part with a plurality of similarly formed protruding mould segments. For a good release the protruding mould segments also protrude perpendicularly of the mould. Alternatively, it is optionally possible to envisage the protruding mould segments narrowing to a limited extent. For a perpendicular through-opening in the encapsulating material it is desirable that the cross-sections through a protruding mould segment parallel to the contact side of the associated mould part have a constant form.

For the purpose of discharging gases and/or encapsulating material present in the mould cavity the mould can comprise at least one venting which connects to the mould cavity defined by the mould parts and enclosing the electronic components for encapsulation.

The carrier can optionally be held in position in the mould with underpressure. In the case positioning is desired using underpressure, a mould part can be provided for this purpose with suction openings extending through the first mould part such that underpressure can engage on the side of the carrier remote from the mould cavity.

According to the invention the carrier with electronic components for encapsulation comprises a plurality of recessed through-openings located at a distance from the electronic components, wherein these through-openings are located precisely where the separating lines for arranging intersect after the encapsulation has been arranged. Such a carrier is provided at the locations where they require the most processing during separation and where the desired shaping freedom of through-openings is greatest so that the carrier no longer need be separated at these locations. The openings in the carrier can be arranged in random manner during the production process of the carrier, for instance by means of punching. It is moreover also the case here that it is easier if less material has to be separated. If separation takes place by means of sawing, this will also result in reduced generation of heat and less wear of the saw blade. Separation can moreover take place more quickly if a part of the material for separating has already been removed.

In an advantageous embodiment at least some of the through-openings recessed into the carrier are provided with elongate opening parts, these elongate opening parts coinciding with the separating lines for arranging after the encapsulation has been arranged. A greater part of the separation to be arranged is thus already "prepared", and no additional cut need be made there. At least some of the through-openings recessed into the carrier can thus take for instance a cross-shaped form. The interior corners of these recessed cross-shaped openings can here take any form as desired (for instance rounded and/or chamfered), and the quality of finish (such as a desired surface roughness) can also be properly controlled and be made independent of the separating process. The separated electronic component can thus also have properties which are advantageous, such as an edge finish such that it is possible to clamp and/or properly engage round the carrier in controllable manner.

The mould and the carrier as described above therefore form an improved assembly, wherein an increased quality of finish can be obtained in an economically advantageous manner, wherein some degree of inaccuracy in the recessing of through-openings in the carrier is permitted. This is because co-action between the mould segments of the above described mould and the carrier into which according to the invention a plurality of through-openings located a distance from the electronic components are recessed and wherein the protruding mould segments have a contact side lying in the contact surface of the mould part of which they form part, and the contact side is configured to engage on the carrier such that the contact side coincides at least partially with some of the through-openings recessed into the carrier, provides the option of determining the quality of finish of the through-openings recessed into the carrier by means of the encapsulating material. The assembly of a mould as described above and a carrier as likewise described above also forms part of the present invention.

The present invention also provides a carrier as described above which is provided with an encapsulation arranged round the electronic components, wherein through-openings are recessed into the encapsulating material and wherein some of the through-openings recessed into the carrier coincide at least partially with the through-openings recessed into the encapsulating material. It is thus possible to prevent, among other things, that encapsulating material flows into the openings in the carrier during the encapsulation. In other words, the openings in the carrier can thus be partially covered. It should be noted that according to the invention an incomplete connection of the two through-openings in carrier and encapsulating material brings very advantageous results. It thus becomes possible for instance to arrange the encapsulating material to limited extent over the edges of the opening in the carrier and to thus allow the quality of finish of the opening in the carrier to be determined by the encapsulating material. This can for instance result in corners and/or upright edges of the carrier which are enclosed by encapsulating material, and this can for instance result in rounded, smooth corners and uprights sides. The quality of finish of the through-openings in the carrier hereby becomes less critical; the openings in the carrier can therefore be arranged more quickly and inexpensively. Another advantage is that it will hereby be possible to increase the adhesion of the encapsulating material and the carrier; after all, the adhesion can now also partly become a form-fitting adhesion. A good adhesion between encapsulating material and carrier results in better product specifications of the encapsulated electronic component.

At least part of the through-openings recessed into the encapsulating material can be provided with elongate opening parts, these elongate opening parts coinciding with separating lines to be arranged. In this combination of encapsulating material and carrier a simplified separation is possible (quicker, less generation of heat, less waste, less wear of tools, less consumption of encapsulating material) and the quality of finish of the separated products can be enhanced. The freedom for shaping the separated electronic components can moreover increase, while a relatively simple separating technique (such as sawing) can nevertheless be applied. These advantages can be obtained particularly when at least 90%, and preferably more than 95%, of the surface area of the through-opening recessed into the carrier coincides with an associated opening recessed into the encapsulation.

The present invention also comprises the encapsulated electronic component separated from a carrier as described above, wherein over at least a part of the periphery of the separated encapsulated electronic component the upright side is defined wholly by the openings recessed into the encapsulating material. In the case of at least a part of the corners of the separated encapsulated electronic component the upright side can be defined wholly here by the openings recessed into the encapsulating material. In addition to the advantages already stated above during the production of such a separated electronic component, it will be possible to realize such a product with an exceptionally high quality of finish. Both the quality of the upright sides and the freedom in shaping the separating lines can be greater than the comparable properties of the separated encapsulated electronic components of the prior art.

The present invention moreover provides a method for encapsulating electronic components mounted on a carrier, comprising the processing steps of: A) providing the carrier with electronic components for encapsulating, which carrier is provided with a plurality of recessed through-openings located a distance from the electronic components; B) enclosing the carrier between at least two mould parts such that a mould cavity engages round the electronic components for encapsulating; C) feeding a liquid encapsulating material to the mould cavity; and D) at least partially curing the encapsulating material in the mould cavity; wherein the encapsulating material is introduced into the mould cavity such that the openings recessed into the carrier connect partially to through-openings recessed into the encapsulating material. The method can additionally comprise the processing steps of: E) removing the carrier with encapsulated electronic components from the mould cavity; and F) separating encapsulated electronic components by arranging cuts between the through-openings. With this method it is possible to realize the advantages as already described above with reference to the mould, the carrier, the encapsulated carrier and separated electronic component according to the present invention. In this method the separation can be performed during processing step F) by means of sawing, without this entailing a number of the limitations which do occur in the separation according to the prior art.

BRIEF DESCRIPTION OF THE DRAWINGS

The present invention will be further elucidated on the basis of the non-limitative exemplary embodiments shown in the following figures. Herein.

DETAILED DESCRIPTION OF THE INVENTION

Figure 1:
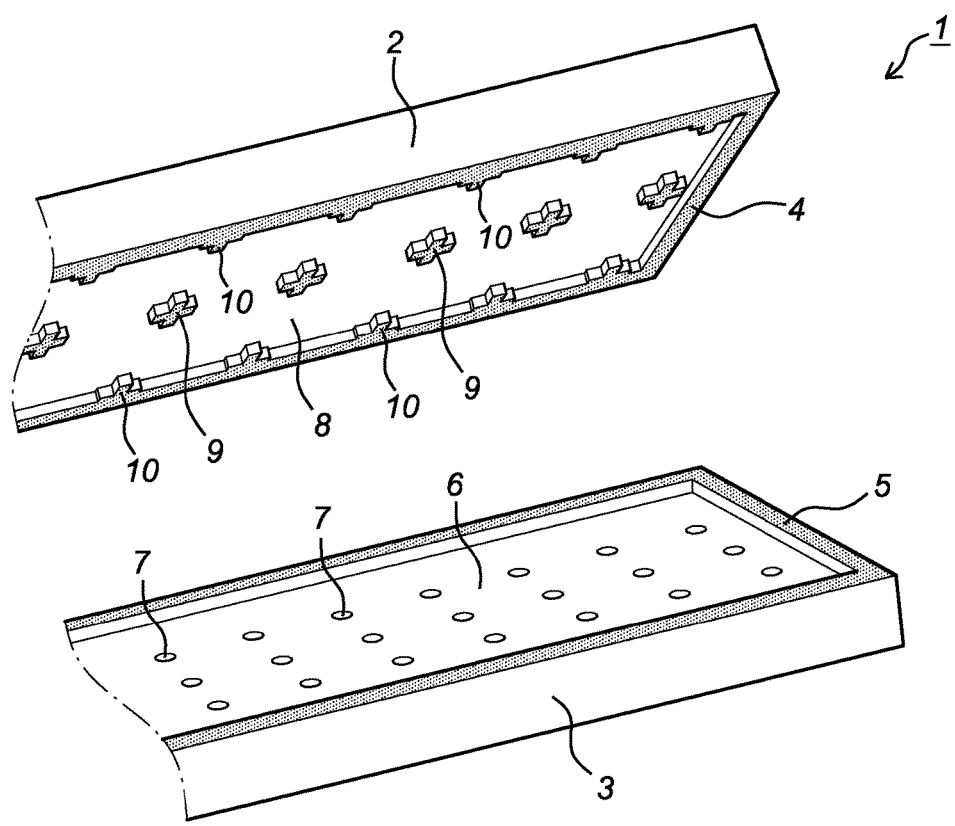
FIG. 1 is a perspective view of a part of a mould according to the present invention.

FIG. 1 shows a mould 1 according to the present invention consisting of an upper mould part 2 and a lower mould part 3 displaceable relative to each other. Upper mould part 2 and lower mould part 3 are both provided with a contact side 4, 5 with which mould parts 2, 3 can connect to each other. Incorporated into lower mould part 3 is a receiving space 6 for a carrier (not shown in this figure), in the underside of which suction openings 7 are arranged to enable positioning of a carrier in receiving space 6 using underpressure. Upper mould part 2 is provided with a mould cavity 8 in which a curing encapsulating material can be arranged such that a housing of encapsulating material is formed on a carrier held by lower mould part 3. Protruding mould segments 9, 10 are present in mould cavity 8. The encapsulating material to be introduced into receiving space 6 cannot be present where these protruding mould segments 9, 10 are located, so that the presence of the protruding mould segments 9, 10 in receiving space 6 will result in correspondingly formed recesses in the housings to be manufactured from encapsulating material. This will be further elucidated below.

Figure 2:
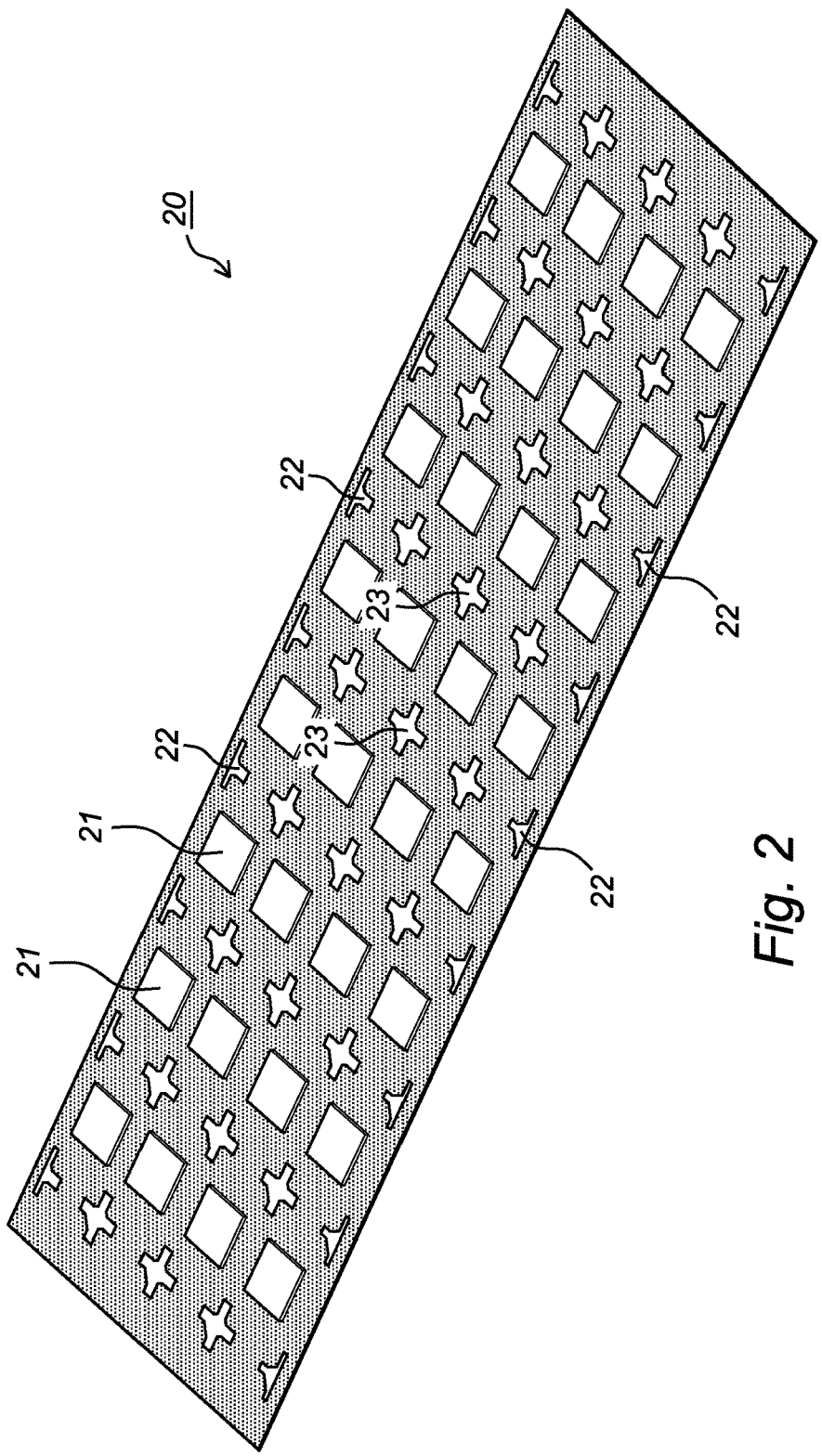
FIG. 2 is a perspective view of a carrier with electronic components for encapsulating according to the present invention.

FIG. 2 shows a carrier 20 with electronic components 21 for encapsulating. Carrier 20 can for instance consist of a multi-layered board 20 on which are located chips 21 for encapsulating. Openings 22, 23 are arranged in carrier 20 at locations where board 20 will have to be separated once an encapsulation has been arranged. Openings 22 are substantially cross-shaped such that the legs of the cross coincide with the separating lines to be arranged later. Openings 22 are thus arranged in board 20 in order to support the separations to be arranged at a later stage.

Figure 3:
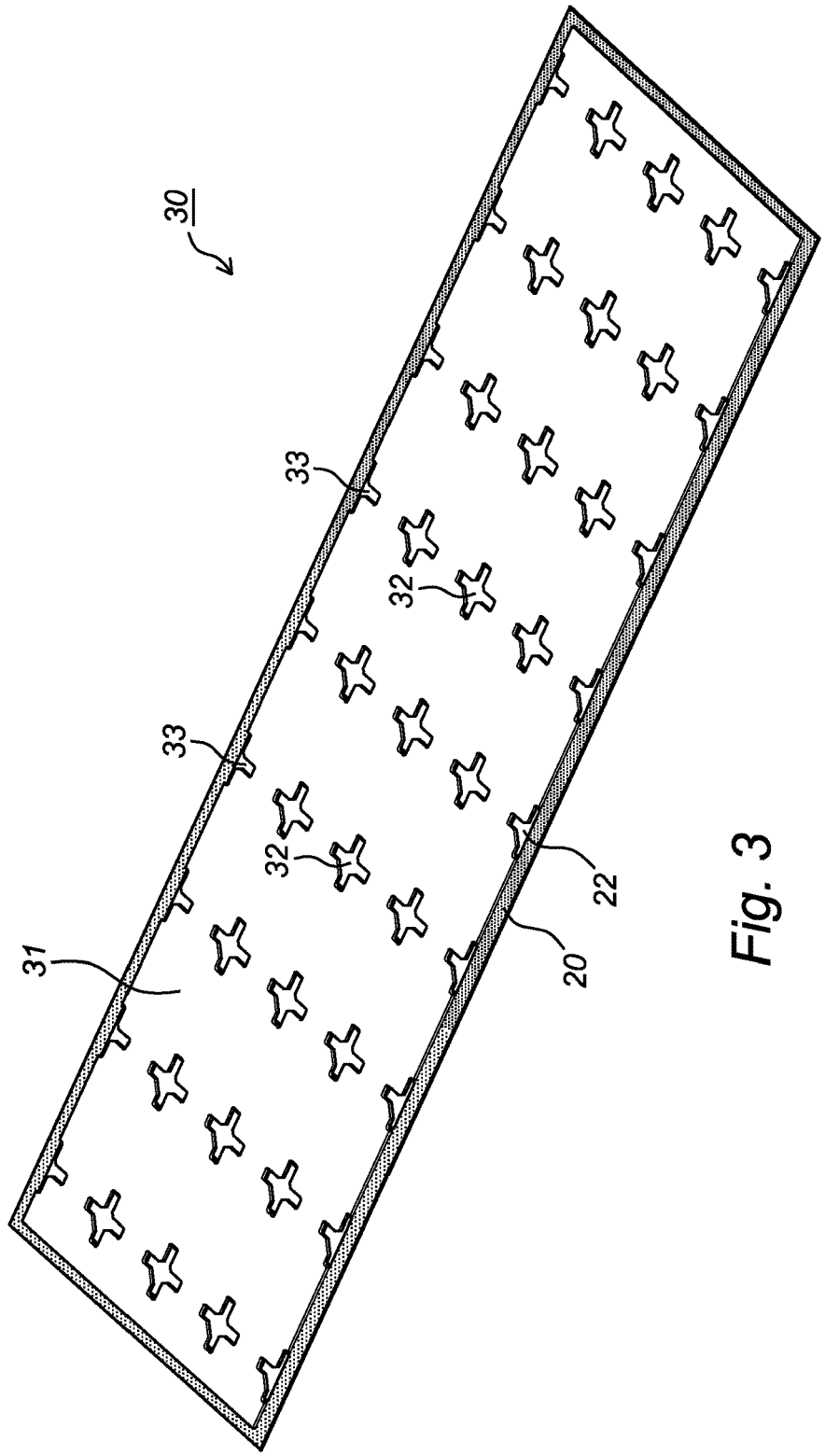
FIG. 3 is a perspective view of a carrier with encapsulated electronic components according to the present invention.
Figure 4:
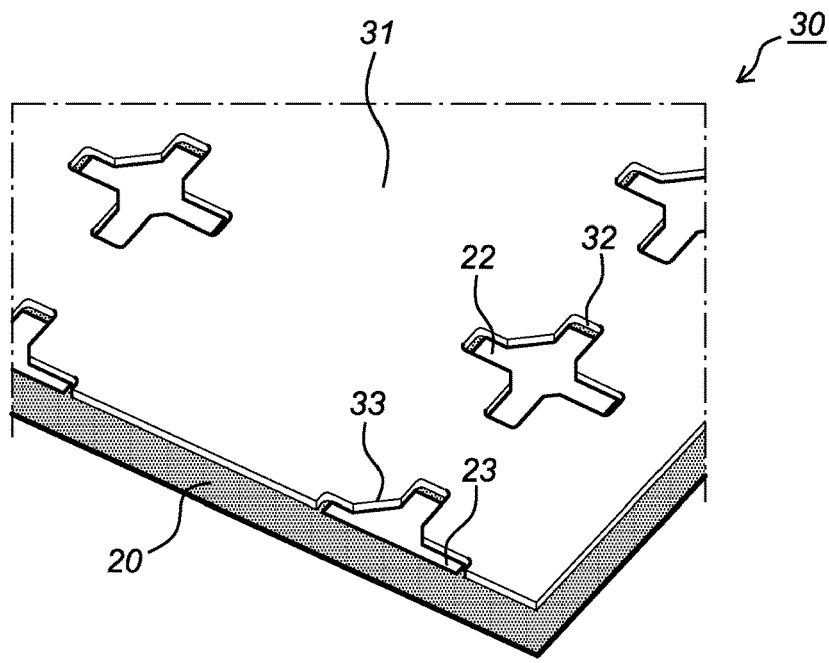
FIG. 4 is a perspective view of a detail of the carrier with encapsulated electronic components as shown in FIG. 3.

FIG. 3 shows a carrier with encapsulated electronic components 30 which is made up of the carrier 20 of FIG. 2 and an encapsulation 31 arranged therearound and manufactured from cured encapsulating material. Encapsulation 31 covers the chips 21 which are no longer visible in this figure (see FIG. 2). Recessed into encapsulation 31 are through-openings 32, 33 which coincide to a significant extent with through-openings 22, 23 (see also FIG. 2) in carrier 20. FIG. 4 shows a detail of the carrier with encapsulated electronic components 30 of FIG. 3 in which through-openings 32, 33 in encapsulation 31 and through-openings 22, 23 in carrier 20 are more clearly visible.

Figure 5:
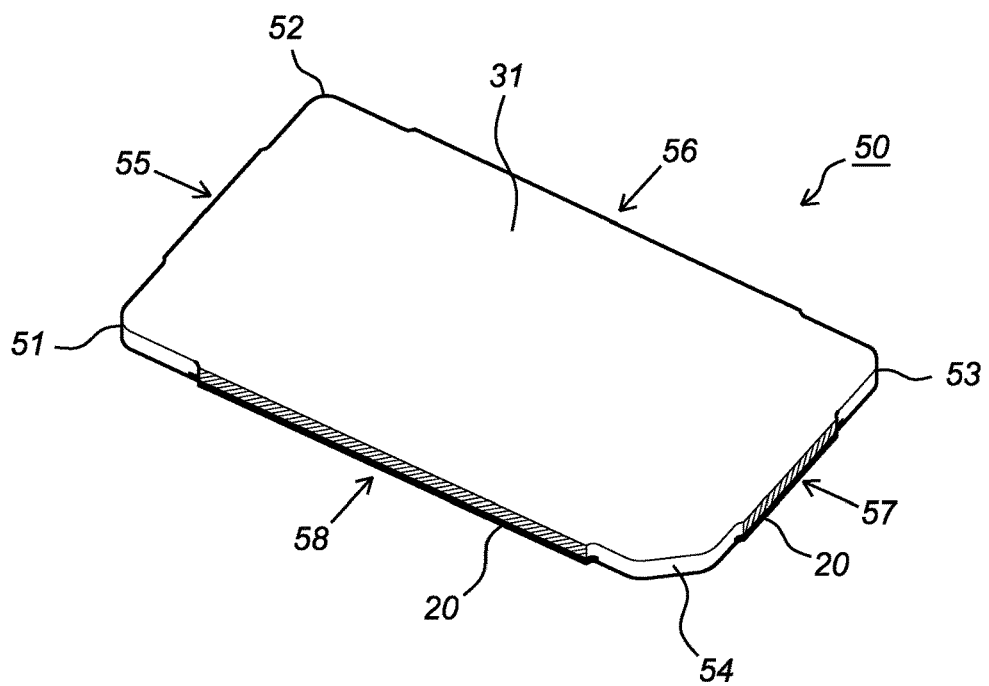
FIG. 5 is a perspective view of an encapsulated electronic component according to the present invention separated in FIGS. 3 and 4.

FIG. 5 shows a separated encapsulated electronic component 50 according to the present invention. The corners 51-54 of this encapsulated component 50 have already been fully formed by arranging the encapsulation 31 on carrier 20 (see FIGS. 3 and 4). For separation purposes these corners 51-54 did not therefore need to undergo a further separating process following arrangement of encapsulation 31. This is also visible in that corners 51-54 are formed wholly by encapsulating material 31. This is because encapsulating material 31 has also flowed over the upright sides of carrier 20 at corners 51-54 and has cured there. Corner 54 also has a chamfered form because openings 22, 23 in carrier 20 and openings 32, 33 in encapsulating material 33 have anticipated this; this chamfering is also discernibly present there. It will be apparent that other differently formed corners can also be manufactured in similar manner. The longitudinal sides 55-58 of the encapsulated electronic components 50 are indeed processed during separation of components 50 from the carrier with encapsulated electronic components 30. Because these longitudinal sides can be embodied as straight sides, they can be arranged in efficient manner by means of sawing. Both the encapsulating material 31 and carrier 20 are cut through during the sawing. Openings 22, 23 in carrier 20 and openings 32, 33 in encapsulating material 33 result in it being necessary to cut through less material during the separation and make the separation possible via relatively simple patterns (linear patterns), while the end product (the separated encapsulated electronic component 50) can still have a form not made up of only straight (saw) cuts.

The invention claimed is:

1. A mould for encapsulating electronic components mounted on a shared carrier, comprising:
    multiple components in a single encapsulation, formed inside a single cavity;
    at least two mould parts which are displaceable relative to each other and each provided with a contact side, and which are configured to engage with at least one mould cavity round the electronic components for encapsulating mounted on a carrier; and
    at least one feed for encapsulating material recessed into the mould parts and connecting to the mould cavity,
    wherein the carrier is provided with a plurality of recessed through-openings located at a distance from the electronic components and at least one of the mould parts is provided with protruding mould segments which protrude such that they are located in the mould cavity defined by the mould parts and thus define a part of the periphery of the encapsulations to be formed, and
    wherein the protruding mould segments have a contact side located in the contact surface of the mould part of which they form part, and that the contact side coincides at least partially with some of the through-openings recessed into the carrier.

2. The mould as claimed in claim 1, wherein the protruding mould segments define a part of the periphery of complex form in the encapsulations to be formed.

3. The mould as claimed in claim 1, wherein the protruding mould segments define a rounded corner of the periphery of the encapsulations to be formed.

4. The mould as claimed in claim 1, wherein a mould part is provided with a plurality of similarly formed protruding mould segments.

5. The mould as claimed in claim 1, wherein the protruding mould segments protrude perpendicularly.

6. The mould as claimed in claim 1, wherein the cross-sections through a protruding mould segment parallel to the contact side of the associated mould part have a constant form.

7. The mould as claimed in claim 1, wherein the mould comprises at least one venting connecting to the mould cavity.

8. The mould as claimed in claim 1, wherein a mould part is provided with suction openings extending through the first mould part for engaging with underpressure on the side of the carrier remote from the mould cavity.

* * * * *